United States Patent
Liu et al.

(10) Patent No.: US 11,919,997 B2
(45) Date of Patent: Mar. 5, 2024

(54) WHITE PHOTOSENSITIVE RESIN COMPOSITION, WHITE SPACER, LIGHT CONVERSION LAYER, AND LIGHT-EMITTING DEVICE

(71) Applicant: eChem Solutions Corp., Taoyuan (TW)

(72) Inventors: Meng-Po Liu, Taoyuan (TW); Yu-Chun Chen, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 238 days.

(21) Appl. No.: 17/329,159

(22) Filed: May 25, 2021

(65) Prior Publication Data

US 2021/0388158 A1     Dec. 16, 2021

(30) Foreign Application Priority Data

Jun. 10, 2020   (TW) .................................. 109119487

(51) Int. Cl.

| | | |
|---|---|---|
| C08F 2/46 | (2006.01) | |
| C08F 2/06 | (2006.01) | |
| C08F 2/50 | (2006.01) | |
| C08G 61/04 | (2006.01) | |
| C08G 63/688 | (2006.01) | |
| C08K 3/22 | (2006.01) | |
| F21V 9/40 | (2018.01) | |
| H01L 33/50 | (2010.01) | |

(52) U.S. Cl.
CPC .............. *C08G 63/688* (2013.01); *C08F 2/06* (2013.01); *C08F 2/50* (2013.01); *C08K 3/22* (2013.01); C08G 2650/24 (2013.01); C08G 2650/64 (2013.01); C08K 2003/2241 (2013.01); *F21V 9/40* (2018.02); *H01L 33/502* (2013.01)

(58) Field of Classification Search
CPC .......... C08F 2/06; C08F 2/50; C09D 133/062; C08K 3/22; C08K 3/013; C08K 2003/2241; H01L 33/502; C08G 63/688; C08G 2650/64; C08G 2650/24; F21V 9/40

USPC ........................ 528/290, 288, 272, 271; 520/1
See application file for complete search history.

(56) References Cited

U.S. PATENT DOCUMENTS

| | | | | |
|---|---|---|---|---|
| 4,594,310 A | * | 6/1986 | Nagasaka | ................. C08F 2/50 430/920 |
| 2016/0161847 A1 | * | 6/2016 | Araki | ................... G03F 7/0035 430/7 |
| 2021/0382389 A1 | * | 12/2021 | Chen | ....................... G03F 7/027 |

FOREIGN PATENT DOCUMENTS

| | | |
|---|---|---|
| CN | 101960380 | 1/2011 |
| CN | 107001631 | 8/2017 |
| CN | 108026194 | 5/2018 |
| JP | H10319225 | 12/1998 |
| JP | 2016117832 | 6/2016 |
| JP | 2016117833 | 6/2016 |
| JP | 2017090761 | 5/2017 |
| JP | 2017206572 | 11/2017 |
| TW | I485512 | 5/2015 |
| TW | I525145 | 3/2016 |
| TW | I571705 | 2/2017 |
| TW | I572980 | 3/2017 |
| TW | 201814402 | 4/2018 |
| TW | 201835251 | 10/2018 |
| TW | I643887 | 12/2018 |
| TW | 201912763 | 4/2019 |
| TW | I658325 | 5/2019 |

OTHER PUBLICATIONS

"Office Action of Taiwan Counterpart Application", dated Nov. 30, 2020, p. 1-p. 6.

\* cited by examiner

*Primary Examiner* — Jessica Whiteley
(74) *Attorney, Agent, or Firm* — JCIPRNET

(57) ABSTRACT

A white photosensitive resin composition, a white spacer, a light conversion layer, and a light-emitting device are provided. The white photosensitive resin composition includes a polymerizable compound (A), an alkali-soluble resin (B), a photopolymerization initiator (C), a solvent (D), and a white pigment (E). The polymerizable compound (A) includes an ethylenically-unsaturated monomer (A-1) represented by formula (I-1) and a thiol compound (A-2) having two or more thiol groups in one molecule, wherein based on 100 mass % of the polymerizable compound (A), a total content of the ethylenically-unsaturated monomer (A-1) and the thiol compound (A-2) is 10 mass % to 98 mass %.

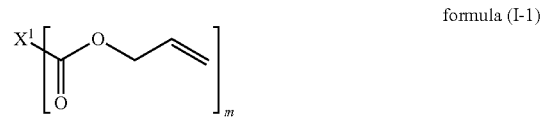

formula (I-1)

18 Claims, 2 Drawing Sheets

WHITE PHOTOSENSITIVE RESIN COMPOSITION, WHITE SPACER, LIGHT CONVERSION LAYER, AND LIGHT-EMITTING DEVICE

CROSS-REFERENCE TO RELATED APPLICATION

This application claims the priority benefit of Taiwan application serial no. 109119487, filed on Jun. 10, 2020. The entirety of the above-mentioned patent application is hereby incorporated by reference herein and made a part of this specification.

BACKGROUND OF THE INVENTION

Field of the Invention

The invention relates to a photosensitive resin composition, a spacer, a light conversion layer, and a light-emitting device, and in particular to a white photosensitive resin composition, a white spacer, a light conversion layer, and a light-emitting device.

Description of Related Art

At present, a color light filter is mainly formed by a pigment dispersion method. The manufacturing process is to first use a black matrix as a spacer, then coat a photosensitive resin composition containing red, green, and blue colorants, and then obtain a target pattern via processes such as coating, vacuum drying, soft baking, exposure, development, and hard baking. In recent years, a color light filter formed using a photosensitive resin composition containing a pigment aims to achieve high resolution while also requiring high brightness, high contrast, and high color saturation in color. However, when the pigment dispersion method is used, because the coloring agent is a pigment or a dye, the transmission efficiency of the backlight source is reduced, and the requirements of high brightness, high contrast, and high color saturation may not be achieved.

Therefore, in recent years, a photoluminescent optical element such as a quantum dot display has been developed that spontaneously emits with a quantum dot through a light source to generate light in the visible and infrared regions, and a target light-emitting performance is obtained by controlling the size and composition of the photoluminescent optical element itself. The quantum dot itself is a non-scattering particle. Therefore, when light passes through a color light filter containing a quantum dot, better color performance than a coloring agent generally formed by a pigment or a dye may be obtained. In the manufacturing process of an optical element such as a quantum dot display and an organic electroluminescence (EL) element, pattern printing is sometimes performed by an inkjet method to facilitate the forming of a light-emitting layer and an organic layer, etc., and when pattern printing is performed by the inkjet method, in order to prevent the ink between adjacent points from mixing with each other, the surface of the spacer must have ink repellency. However, at present, the spacer is mostly based on a black matrix. For a photoluminescent optical element such as a quantum dot display, the photoluminescence characteristics of the quantum dot need to be excited with blue light at a wavelength of 450 nm. If an old-fashioned black matrix is used, the quantum dot light conversion layer may not emit light efficiently, thus resulting in a reduction in light utilization and causing poor brightness.

At present, the industry has developed a white photoresist to which a white pigment is added as a white matrix to increase the reflectivity and alleviate the phenomenon of poor light utilization and poor brightness. However, the white photoresist needs to not let a yellowing phenomenon occur to a panel at a high temperature of 250° C., and a high-precision pattern is more difficult to be achieved in miniaturization and at an opening, and residue also readily occurs.

SUMMARY OF THE INVENTION

The inventors of the invention found that to increase the reflectivity of a white photoresist, more white pigments need to be used, but this method causes the reactivity of the white photoresist to be reduced and the pattern and the opening to be incomplete, resulting in poor resolution. Moreover, if the resolution of the white photoresist is to be improved, more white photoresists or highly reactive materials are needed, but this method causes insufficient whiteness or yellowing of the white matrix, resulting in reduced reflectivity.

Accordingly, the invention provides a white photosensitive resin composition having good resolution, heat resistant reflectivity, and ink repellency, a white spacer formed using the white photosensitive resin composition, a light conversion layer, and a light-emitting device.

The invention provides a white photosensitive resin composition including a polymerizable compound (A), an alkali-soluble resin (B), a photopolymerization initiator (C), a solvent (D), and a white pigment (E). The polymerizable compound (A) includes an ethylenically-unsaturated monomer (A-1) represented by formula (I-1) and a thiol compound (A-2) having two or more thiol groups in one molecule. Based on 100 mass % of the polymerizable compound (A), a total content of the ethylenically-unsaturated monomer (A-1) and the thiol compound (A-2) is 10 mass % to 98 mass %.

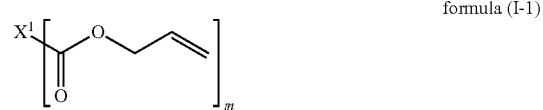

formula (I-1)

In formula (I-1), $X^1$ represents a divalent to tetravalent organic group, and m represents an integer of 2 to 4.

In an embodiment of the invention, in formula (I-1), when m represents 2, $X^1$ represents a divalent alicyclic group, a divalent aromatic group, or a divalent heterocyclic group.

In an embodiment of the invention, in formula (I-1), when m represents 2, $X^1$ represents 1,2-phenylene, 1,3-phenylene, or 1,4-phenylene.

In an embodiment of the invention, the thiol compound (A-2) is a compound represented by formula (I-2).

formula (I-2)

In formula (I-2), $X^2$ represents a divalent to tetravalent organic group, and n represents an integer of 2 to 4.

In an embodiment of the invention, in formula (I-2), when n represents 4, $X^2$ represents a tetravalent alkane tetrayl group.

In an embodiment of the invention, the polymerizable compound (A) further includes a fluorine-containing ethylenically-unsaturated monomer (A-3) represented by formula (I-3).

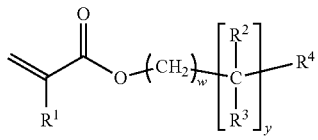

formula (I-3)

In formula (I-3), $R^1$ represents a hydrogen atom or a methyl group, $R^2$ and $R^3$ respectively represent a hydrogen atom or a fluorine atom, at least one of $R^2$ and $R^3$ is a fluorine atom, $R^4$ represents a hydrogen atom, a fluorine atom, or an alkyl group, w represents an integer of 1 to 10, and y represents an integer of 1 to 10.

In an embodiment of the invention, based on 100 mass % of the polymerizable compound (A), the fluorine-containing ethylenically-unsaturated monomer (A-3) is 0.5 mass % to 5 mass %.

In an embodiment of the invention, the alkali-soluble resin (B) does not contain fluorine.

In an embodiment of the invention, the alkali-soluble resin (B) includes an alkali-soluble resin (B-1), wherein the alkali-soluble resin (B-1) includes a structural unit represented by formula (II-1) and a structural unit represented by formula (II-2),

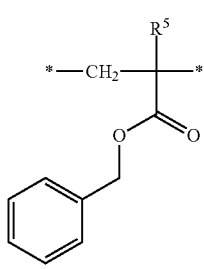

formula (II-1)

In formula (II-1), $R^5$ represents a hydrogen atom or a methyl group, and * represents a bonding position.

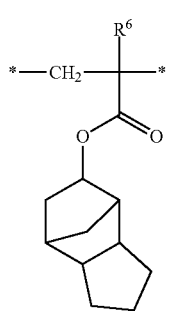

formula (II-2)

In formula (II-2), $R^6$ represents a hydrogen atom or a methyl group, and * represents a bonding position.

In an embodiment of the invention, the photopolymerization initiator (C) includes an acylphosphine oxide compound represented by formula (III-1).

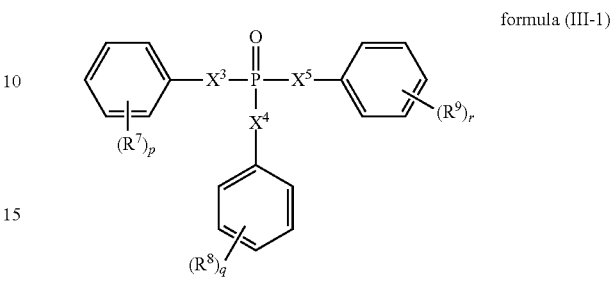

formula (III-1)

In formula (III-1), $X^3$, $X^4$, and $X^5$ respectively represent a single bond or a carbonyl group, at least one of $X^3$, $X^4$, and $X^5$ is a carbonyl group, $R^7$, $R^8$, and $R^9$ respectively represent an alkyl group, and p, q, and r respectively represent an integer of 0 to 5.

In an embodiment of the invention, the white pigment (E) is at least one selected from the group consisting of aluminum oxide, magnesium oxide, antimony oxide, titanium oxide, zirconium oxide, zinc oxide, silicon dioxide, aluminum hydroxide, magnesium hydroxide, barium sulfate, calcium sulfate, magnesium carbonate, barium carbonate, calcium carbonate, strontium titanate, aluminum powder, kaolin, clay, talc, barium titanate, and montmorillonite.

The invention provides a white spacer formed by the white photosensitive resin composition above.

In an embodiment of the invention, a contact angle of the white spacer is 90°.

The invention provides a light-emitting device including the white spacer above.

The invention provides a light conversion layer including a plurality of pattern layers and a plurality of white spacers formed by the white photosensitive resin composition above, wherein the plurality of white spacers are respectively interposed between the plurality of pattern layers, so that one of the plurality of pattern layers is present between every two adjacent white spacers in the plurality of white spacers.

In an embodiment of the invention, the pattern layers are a red pattern layer, a green pattern layer, or a scatterer pattern layer.

The invention provides a light-emitting device, including: a substrate, a backlight module disposed opposite to the substrate, and a light conversion layer located between the substrate and the backlight module, wherein the light conversion layer is the light conversion layer above.

In an embodiment of the invention, the light-emitting device further includes a light filter layer located between the substrate and the light conversion layer.

Based on the above, the white photosensitive resin composition of the invention includes a specific polymerizable compound to provide a white photosensitive resin composition having good resolution, heat resistant reflectivity, and ink repellency, thereby achieving the effect of having both good resolution and good reflectivity.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

<White Photosensitive Resin Composition>

Figure 1:
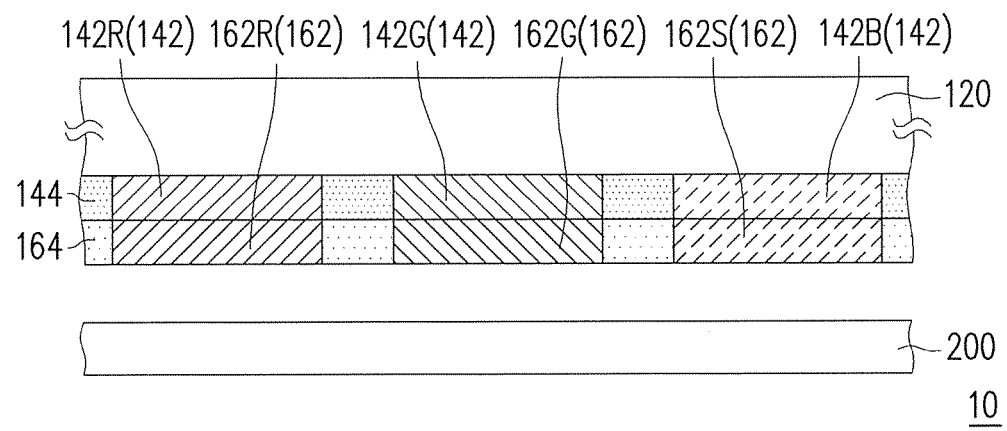
FIG. 1 is a diagram of a light-emitting device according to an embodiment of the invention.

The present embodiment provides a white photosensitive resin composition including a polymerizable compound (A), an alkali-soluble resin (B), a photopolymerization initiator (C), a solvent (D), and a white pigment (E). Moreover, the white photosensitive resin composition may further include other additives (F) if needed. In the following, the individual components used in the white photosensitive resin composition of the invention are described in detail.

It should be mentioned that, in the following, (meth) acrylic acid represents acrylic acid and/or methacrylic acid, and (meth)acrylate represents acrylate and/or methacrylate. Moreover, a (meth)acryloyl group represents an acryloyl group and/or methacryloyl group.

Polymerizable Compound (A)

The polymerizable compound (A) in the white photosensitive resin composition may undergo a polymerization reaction in a subsequent exposure step and baking step to form the white photosensitive resin composition into a white spacer.

The polymerizable compound (A) includes an ethylenically-unsaturated monomer (A-1) and a thiol compound (A-2) having two or more thiol groups in one molecule. In addition, the polymerizable compound (A) may further include a fluorine-containing ethylenically-unsaturated monomer (A-3).

Ethylenically-Unsaturated Monomer (A-1)

The ethylenically-unsaturated monomer (A-1) is a compound represented by the following formula (I-1).

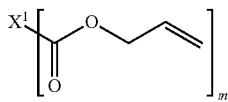

formula (I-1)

In formula (I-1), $X^1$ represents a divalent to tetravalent organic group, and preferably represents a divalent organic group;

m represents an integer of 2 to 4, and preferably represents an integer of 2.

In an embodiment, when m represents 2, $X^1$ represents a divalent alicyclic group, a divalent aromatic group, or a divalent heterocyclic group. Specifically, the divalent alicyclic group may be a divalent alicyclic group having 3 to 7 carbon atoms, such as a divalent cyclohexane group, a divalent cycloheptane group, or the like. The divalent aromatic group may be a divalent aromatic group having 6 to 10 carbon atoms, such as 1,2-phenylene, 1,3-phenylene, 1,4-phenylene, naphthalene-1,4-diyl, naphthalene-1,5-diyl, or naphthalene-2,6-diyl. The divalent heterocyclic group may be a divalent group of a three-membered ring to a ten-membered ring having a nitrogen atom, a hydrogen atom, or a sulfur atom such as a group from which two hydrogen atoms are removed in a nitrogen-containing heterocyclic compound such as pyrazine, pyrimidine, pyridazine, triazine, pyrrole, 2H-pyrrole, imidazole, pyrazole, isothiazole, isoxazole, pyridine, indazine, isoindole, 3H-indole, indole, 1H-indazole, purine, 4H-quinazine, quinoline, isoquinoline, phthalazine, naphthyridine, quinoxaline, quinazoline, cinnoline, pteridine, carbazole, carboline, phenanthridine, acridine, perimidine, phenanthroline, phenazine, phenothiazine, furazane, phenoxazine, pyrrolidine, pyrroline, imidazoline, imidazolidine, pyrazolidine, pyrazoline, piperidine, piperazine, indoline, isoindoline, quinuclidine, oxazole, benzoxazole, 1,3,5-triazine, tetrazole, tetrazine, triazole, phenarsazine, benzimidazole, benzotriazole, thiazole, benzothiazole, thiadiazole, or benzothiadiazole. $X^1$ preferably represents 1,2-phenylene, 1,3-phenylene, or 1,4-phenylene.

Specific examples of the ethylenically-unsaturated monomer (A-1) include diallyl phthalate, diallyl isophthalate, diallyl terephthalate, triallyl isocyanurate, tetraallyl pyromellitate, or a combination of the above compounds. Specific examples of the ethylenically-unsaturated monomer (A-1) preferably include diallyl phthalate, diallyl terephthalate, or a combination of the above compounds.

Thiol Compound (A-2) Having Two or More Thiol Groups in One Molecule

The thiol compound (A-2) having two or more thiol groups in one molecule is a compound represented by formula (I-2).

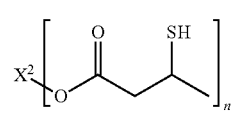

formula (I-2)

In formula (I-2), $X^2$ represents a divalent to tetravalent organic group, and preferably represents a tetravalent organic group;

n represents an integer of 2 to 4, and preferably represents an integer of 4.

In an embodiment, when n represents 4, $X^2$ represents a tetravalent alkane tetrayl group, and preferably represents a tetravalent alkane tetrayl group.

Specific examples of the thiol compound (A-2) include trimethylolpropane tris(3-mercaptobutyrate), trimethylolethane tris(3-mercaptobutyrate), 1,4-butanediol bis(3-mercaptobutyrate), tri[2-(3-mercaptobutyrate)ethyl]isocyanurate, pentaerythritol tetrakis(3-mercaptobutyrate). Specific examples of the thiol compound (A-2) preferably include pentaerythritol tetrakis(3-mercaptobutyrate), 1,4-butanediol bis(3-mercaptobutyrate), or a combination of the above compounds. A specific example of the thiol compound (A-2) more preferably includes pentaerythritol tetrakis(3-mercaptobutyrate).

Based on 100 mass % of the polymerizable compound (A), the total content of the ethylenically-unsaturated monomer (A-1) and the thiol compound (A-2) is 10 mass % to 98 mass %. When the total content of the ethylenically-unsaturated monomer (A-1) and the thiol compound (A-2) is within the above range, the resolution and heat resistant reflectivity of the white photosensitive resin composition and the resulting spacer are both good. Conversely, when the total content of the ethylenically-unsaturated monomer (A-1) and the thiol compound (A-2) is not within the above range, the resolution and the heat resistant reflectivity of the white photosensitive resin composition and the resulting spacer are poor.

Fluorine-Containing Ethylenically-Unsaturated Monomer (A-3)

The fluorine-containing ethylenically-unsaturated monomer (A-3) is a compound represented by the following formula (I-3).

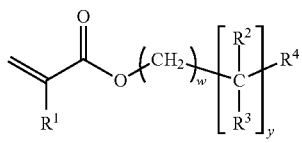

formula (I-3)

In formula (I-3), $R^1$ represents a hydrogen atom or a methyl group, and preferably represents a hydrogen atom;

$R^2$ and $R^3$ respectively represent a hydrogen atom or a fluorine atom, at least one of $R^2$ and $R^3$ is a fluorine atom, and preferably $R^2$ and $R^3$ both represent a fluorine atom;

$R^4$ represents a hydrogen atom, a fluorine atom, or an alkyl group, and preferably represents a hydrogen atom;

w represents an integer of 1 to 10, and preferably represents an integer of 1;

y represents an integer of 1 to 10, and preferably represents an integer of 2.

The fluorine-containing ethylenically-unsaturated monomer (A-3) includes 2,2,3,3-tetrafluoropropyl acrylate, 2,2,3,3-tetrafluoropropyl methacrylate, 2,2,2-trifluoroethyl acrylate, 2,2,3,3-tetrafluoropropionate, 2,2,3,3,4,4,5,5-octafluoropentyl acrylate, 3,3,4,4,5,5,6,6,7,7,8,8,8-tridecylfluorooctyl acrylate, or a combination of the above compounds, and preferably includes 2,2,3,3-tetrafluoropropyl acrylate.

Based on 100 mass % of the polymerizable compound (A), the fluorine-containing ethylenically-unsaturated monomer (A-3) may be 0.5 mass % to 5 mass %, preferably 2 mass % to 5 mass %.

When the white photosensitive resin composition includes the fluorine-containing ethylenically-unsaturated monomer (A-3), the white spacer formed by the white photosensitive resin composition has good ink repellency. On the contrary, when the white photosensitive resin composition does not include the fluorine-containing ethylenically-unsaturated monomer (A-3), the white photosensitive resin composition and the resulting spacer have poor ink repellency.

In addition, when the fluorine-containing ethylenically-unsaturated monomer (A-3) included in the white photosensitive resin composition is in the range of 2 mass % to 5 mass %, the ink repellency of the white photosensitive resin composition and the resulting spacer may be further improved.

Other Ethylenically-Unsaturated Compounds (A-4)

Without affecting the efficacy of the invention, the polymerizable compound (A) may also further include other ethylenically-unsaturated compounds (A-4). The other ethylenically-unsaturated compounds (A-4) are not particularly limited, and are, for example, a polyfunctional compound. Specifically, the other ethylenically-unsaturated compounds (A-4) are preferably a trifunctional to hexafunctional compound, and more preferably are a compound having three to six (meth)acryloyl groups.

Specific examples of the polyfunctional compound include pentaerythritol triacrylate, pentaerythritol tetraacrylate, ethoxylated pentaerythritol tetraacrylate, dipentaerythritol hexaacrylate, dipentaerythritol pentaacrylate, or a combination of the above compounds. The polyfunctional monomer preferably includes pentaerythritol triacrylate, pentaerythritol tetraacrylate, dipentaerythritol pentaacrylate, dipentaerythritol hexaacrylate, or a combination of the above compounds. Based on 100 mass % of the polymerizable compound (A), the polyfunctional compound may be 0 mass % to 5 mass %.

Specific examples of the siloxane-based compound include polydimethylsiloxane, polyether-modified polydimethylsiloxane, polymethylalkylsiloxane, and preferably includes polyether-modified polydimethylsiloxane.

Based on 100 mass % of the polymerizable compound (A), the siloxane-based compound may be 0 mass % to 5 mass %.

Alkali-Soluble Resin (B)

The alkali-soluble resin (B) in the white photosensitive resin composition may make the white photosensitive resin composition display alkali solubility to the developing agent in a subsequent development process.

The alkali-soluble resin (B) is not particularly limited, and includes, for example, an alkali-soluble resin (B-1). In addition, the alkali-soluble resin (B) may also include other alkali-soluble resins (B-2).

In an embodiment of the invention, the alkali-soluble resin (B) preferably does not contain fluorine. The alkali-soluble resin (B) without fluorine is weaker in reactivity, and is paired with a suitable polymerizable compound (A) to avoid excessive ink repellency phenomenon and avoid the occurrence of residue in a non-exposed region. For example, when the alkali-soluble resin (B) without fluorine is paired with the polymerizable compound (A) including the fluorine-containing ethylenically-unsaturated monomer (A-3), excessive ink repellency phenomenon from the reaction between the two may be avoided to avoid the occurrence of residue in a non-exposed region, and therefore the white photosensitive resin composition may generate a fine pattern.

Alkali-Soluble Resin (B-1)

The alkali-soluble resin (B-1) includes a structural unit represented by formula (II-1) and a structural unit represented by formula (II-2).

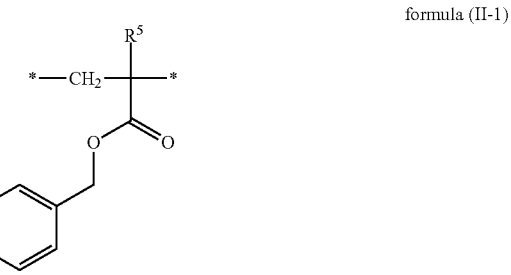

formula (II-1)

In formula (II-1), $R^5$ represents a hydrogen atom or a methyl group, and $R^5$ preferably represents a methyl group;

* represents a bonding position.

formula (II-2)

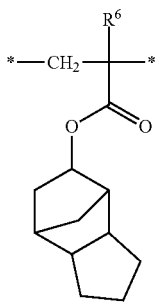

In formula (II-2), $R^6$ represents a hydrogen atom or a methyl group and preferably represents a methyl group; and * represents a bonding position.

In addition, without affecting the efficacy of the invention, the alkali-soluble resin (B-1) may further include an acrylic-based structural unit.

In the invention, the acrylic-based structural unit may be derived from an acrylic-based monomer. The acrylic-based monomer may include acrylate such as acrylic acid, methacrylic acid, methyl acrylate, ethyl acrylate, propyl acrylate, butyl acrylate, octyl acrylate, cyclohexyl acrylate, stearyl acrylate, benzyl acrylate, furfuryl acrylate, hydroxyethyl acrylate, hydroxybutyl acrylate, dimethylaminoethyl methacrylate, or dimethylaminoethyl acrylate, methacrylate such as methyl methacrylate, ethyl methacrylate, propyl methacrylate, butyl methacrylate, octyl methacrylate, cyclohexyl methacrylate, stearyl methacrylate, benzyl methacrylate, furfuryl methacrylate, hydroxyethyl methacrylate, hydroxybutyl methacrylate, dimethylaminomethyl methacrylate, or dimethylaminoethyl methacrylate, amide such as acrylamide, methacrylamide, N-substituted acrylamide, or N-substituted methacrylamide, acrylonitrile, methacrylonitrile, or a combination of the above compounds.

In an embodiment, the alkali-soluble resin (B-1) is an alkali soluble resin (B-1-1) including a structural unit represented by formula (II-1-1), a structural unit represented by formula (II-2-1), and a structural unit represented by formula (1).

formula (1)

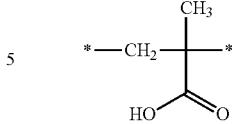

Based on 100 parts by weight of the polymerizable compound (A), the alkali-soluble resin (B-1) may be 20 parts by weight to 400 parts by weight, preferably 40 parts by weight to 200 parts by weight.

In the case where the alkali-soluble resin (B) includes the alkali-soluble resin (B-1), the developability may be adjusted so that the phenomenon of development residue in a non-exposed region does not readily occur.

Other Alkali-Soluble Resins (B-2)

The other alkali-soluble resins (B-2) are not particularly limited.

In an embodiment, the other alkali-soluble resins (B-2) may be an acrylic-based resin. The acrylic-based resin may be formed by using alkyl (meth)acrylate such as (meth)acrylic acid, methyl (meth)acrylate, ethyl (meth)acrylate, propyl (meth)acrylate, butyl (meth)acrylate, tert-butyl (meth)acrylate, benzyl (meth)acrylate, or lauryl (meth)acrylate, hydroxy-containing (meth)acrylate such as hydroxyethyl (meth)acrylate or hydroxypropyl (meth)acrylate, (meth)acrylate containing an ether group such as ethoxyethyl (meth)acrylate or glycidyl (meth)acrylate, and alicyclic (meth)acrylate such as cyclohexyl (meth)acrylate, isophorone (meth)acrylate, or dicyclopentadienyl (meth)acrylate, or a combination of the above compounds as a monomer to form a polymer.

In an embodiment, the other alkali-soluble resins (B-2) may be an alkali soluble resin (B-2-1) including a structural unit represented by formula (II-1-1), a structural unit represented by formula (1), and a structural unit represented by formula (2).

formula (II-1-1)

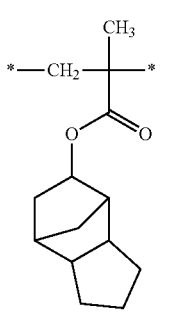

formula (II-2-1)

formula (II-1-1)

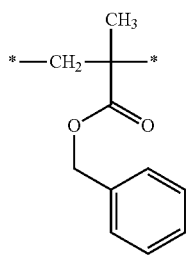

formula (1)

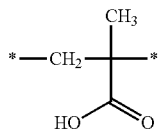

formula (2)

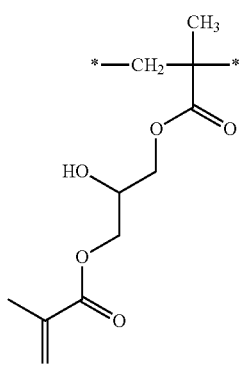

In an embodiment, the other alkali-soluble resins (B-2) may include an alkali-soluble resin (B-2-2) including a structural unit represented by formula (3), a structural unit represented by formula (4), a structural unit represented by formula (5), a structural unit represented by formula (6), and a structural unit represented by formula (7).

formula (3)

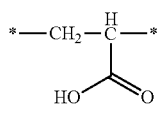

formula (4)

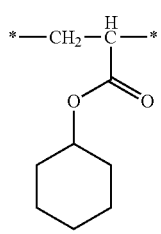

formula (5)

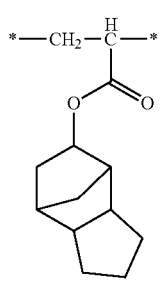

formula (6)

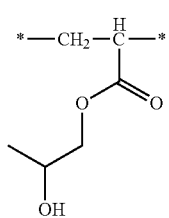

formula (7)

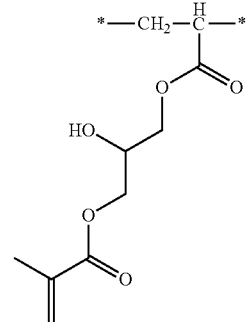

In an embodiment, the other alkali-soluble resins (B-2) may be an alkali-soluble resin (B-2-3) including a structural unit represented by formula (8) and a structural unit represented by formula (9).

formula (8)

formula (9)

Photopolymerization Initiator (C)

The photopolymerization initiator (C) in the white photosensitive resin composition may generate a free radical in a subsequent exposure step and trigger a polymerization reaction to form the white photosensitive resin composition into a white matrix.

The photopolymerization initiator (C) includes an acylphosphine oxide compound (C-1). In addition, the photopolymerization initiator (C) may also include other photopolymerization initiators (C-2).

Acylphosphine Oxide Compound (C-1)

The acylphosphine oxide compound (C-1) is a compound represented by formula (III-1).

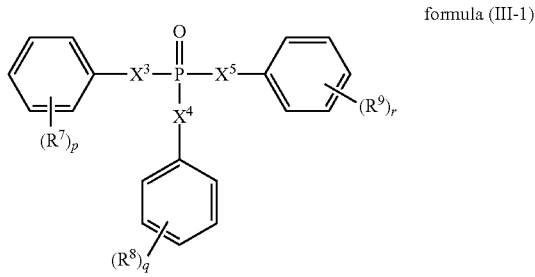

formula (III-1)

In formula (III-1), $X^3$, $X^4$, and $X^5$ respectively represent a single bond or a carbonyl group, and at least one of $X^3$, $X^4$, and $X^5$ is a carbonyl group;

$R^7$, $R^8$, and $R^9$ respectively represent an alkyl group;

p, q, and r represent an integer of 0 to 5, respectively.

Specific examples of the acylphosphine oxide compound (C-1) include 2,4,6-trimethylbenzoyldiphenylphosphine oxide (trade name: TPO, manufactured by BASF, compound represented by the following formula (III-1-1), bis(2,4,6-trimethylbenzoyl)phenylphosphine oxide (trade name: Irgacure 819, manufactured by BASF, compound represented by the following formula (III-1-2)), or a combination of the above compounds.

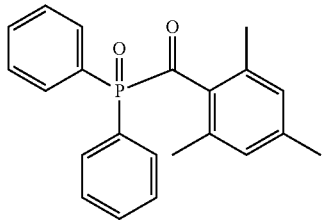

formula (III-1-1)

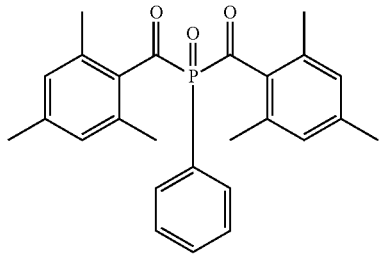

formula (III-1-2)

Based on 100 parts by weight of the polymerizable compound (A), the acylphosphine oxide compound (C-1) may be 2 parts by weight to 50 parts by weight, preferably 2 parts by weight to 10 parts by weight.

Other Photopolymerization Initiators (C-2)

The photopolymerization initiator (C) may also include other photopolymerization initiators (C-2). The other photopolymerization initiators (C-2) may include an oxime ester-based compound, a triazine compound, an acetophenone compound, a diphenyl ketone compound, a diimidazole compound, a thioxanthone compound, a quinone compound, or a combination of the above compounds.

The oxime ester-based compound is a compound represented by formula (III-2).

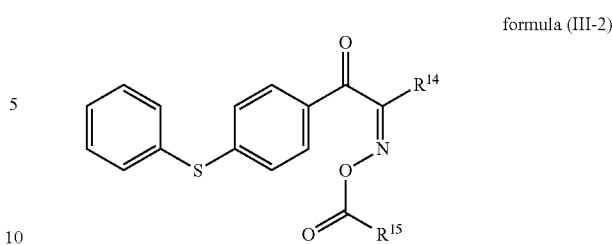

formula (III-2)

In formula (III-2), $R^{14}$ represents an alkyl group or a cycloalkyl group, and preferably represents a hexyl group or a cyclopentyl group;

$R^{15}$ represents an alkyl group or a phenyl group, and preferably represents a methyl group or a phenyl group.

Specific examples of oxime ester-based compound include a compound represented by formula (III-2-1) (1,2-octanedione, 1-[4-(phenylthio)phenyl]-, 2-(O-benzoyloxime)), (trade name: Irgacure OXE-01, manufactured by BASF), a compound represented by formula (III-2-2) (trade name: PBG-3057, manufactured by Changzhou Tronly New Electronic Materials Co., Ltd.), or a combination of the above compounds.

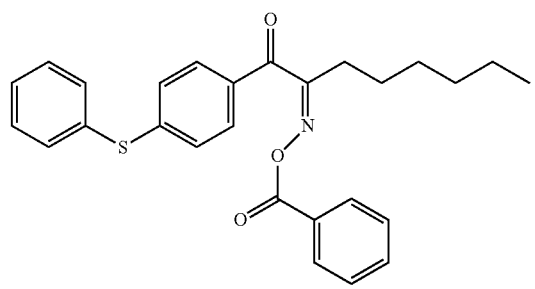

formula (III-2-1)

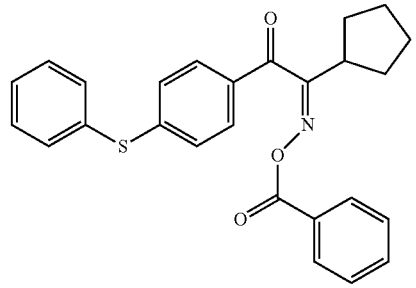

formula (III-2-2)

Specific examples of the triazine compound include Chemcure-PAG-1 (trade name; manufactured by Chembridge International Corp.), Chemcure-PAG-2 (trade name; manufactured by Chembridge International Corp.), or other suitable triazine compounds. The triazine compound may be used alone or in combination.

Specific examples of the acetophenone compound include Irgacure 907 and 369E (trade names; manufactured by BASF), Chemcure-96 (trade name; manufactured by Chembridge International Corp.) or other suitable acetophenone compounds. The acetophenone compound may be used alone or in combination.

Specific examples of the diphenyl ketone compound include Chemcure-BP, Chemcure-64 (trade names; manufactured by Chembridge International Corp.) or other suitable diphenyl ketone compounds. The benzophenone compound may be used alone or in combination.

Specific examples of the diimidazole compound include Chemcure-BCIM, Chemcure-TCDM (trade names; manufactured by Chembridge International Corp.), or other suitable diimidazole compounds. The diimidazole compound may be used alone or in combination.

Specific examples of the thioxanthone compound include Irgacure ITX (trade name; manufactured by BASF) or other suitable thioxanthone compounds. The thioxanthone compound may be used alone or in combination.

As the quinone compound, a suitable quinone compound may be selected. The quinone compound may be used alone or in combination.

Based on 100 parts by weight of the polymerizable compound (A), the photopolymerization initiator (C) may be 2 parts by weight to 50 parts by weight, preferably 5 parts by weight to 20 parts by weight.

Solvent (D)

The solvent (D) in the white photosensitive resin composition not only may be mixed with the polymerizable compound (A), the alkali-soluble resin (B), the photopolymerization initiator (C), and the white pigment (E), but may also provide the white photosensitive resin composition with a suitable viscosity so that the white photosensitive resin composition may be coated on a substrate.

The solvent (D) is not particularly limited as long as it may dissolve the polymerizable compound (A), the alkali-soluble resin (B), the photopolymerization initiator (C), and the white pigment (E), and a suitable solvent may be selected according to needs.

Specific examples of the solvent (D) include propylene glycol monomethyl ether acetate (PGMEA), ethyl 3-ethoxypropionate (EEP), ethyl pyruvate (EP), ethyl lactate, butyl lactate, benzyl alcohol, 3-methoxybutyl acetate (MBA), 3-methoxy-3-methylbutanol, γ-butyrolactone, propylene glycol monobutyl ether, methyl n-isoamyl (methyl)ketone, methyl ethyl ketone, isopropanol, or a combination of the above solvents. The solvent (D) preferably includes propylene glycol monomethyl ether acetate.

Based on 100 parts by weight of the polymerizable compound (A), the solvent (D) may be 300 parts by weight to 1000 parts by weight, preferably 380 parts by weight to 750 parts by weight.

White Pigment (E)

The white photosensitive resin composition may be used to prepare a white matrix (white spacer), and may be applied to a color light filter of a quantum dot light-emitting device. In this way, the white matrix may reflect light to improve the light utilization of the quantum dot light-emitting device and improve the brightness of the quantum dot light-emitting device. Furthermore, the white pigment (E) is used to increase the reflectivity of the white spacer so as to reflect blue light to increase the chance of the blue light being absorbed by a quantum dot, thereby improving the light conversion efficiency of the quantum dot.

The white pigment (E) is at least one selected from the group consisting of aluminum oxide, magnesium oxide, antimony oxide, titanium oxide, zirconium oxide, zinc oxide, silicon dioxide, aluminum hydroxide, magnesium hydroxide, barium sulfate, calcium sulfate, magnesium carbonate, barium carbonate, calcium carbonate, strontium titanate, aluminum powder, kaolin, clay, talc, barium titanate, and montmorillonite.

Based on 100 parts by weight of the polymerizable compound (A), the white pigment (E) may be 70 parts by weight to 350 parts by weight, preferably 100 parts by weight to 200 parts by weight.

Additive (F)

Under the premise of not affecting the efficacy of the invention, the white photosensitive resin composition of the invention may optionally further include an additive (F). The additive (F) is not particularly limited, and specifically, the additive (F) may include a leveling agent. The leveling agent includes a siloxane-based surfactant, a silicone-based surfactant, a fluorine-based surfactant, or a combination thereof.

The siloxane-based surfactant may include a polysiloxane-based surfactant. For example, the siloxane-based surfactant may include BYK-307, BYK-323, BYK-348 (trade names; manufactured by BYK Chemical Co., Ltd.), KP323, KP324, KP340, KP341 (trade names; Shin-Etsu Chemical Industry Co., Ltd.), or other suitable siloxane-based surfactants. The siloxane-based surfactant may be used alone or in combination.

The silicone-based surfactant may include BYK-333 (trade name; manufactured by BYK Chemical Co., Ltd.) or other suitable silicone-based surfactants. The silicone-based surfactant may be used alone or in combination.

The fluorine-based surfactant may include Megaface F-477, F-554, F-556, F-563, F-575, RS-72-K (trade names; manufactured by DIC Co., Ltd.) or other suitable fluorine-based surfactants. The fluorine-based surfactant may be used alone or in combination.

When the resin composition further includes a leveling agent as the additive (F), the white photosensitive resin composition may have good coating uniformity.

Based on 100 parts by weight of the polymerizable compound (A), the additive (F) may be 0.5 part by weight or less, preferably 0.01 part by weight to 0.5 part by weight.

<Preparation Method of White Photosensitive Resin Composition>

The method of preparing the white photosensitive resin composition is not particularly limited. For example, the polymerizable compound (A), the alkali-soluble resin (B), the photopolymerization initiator (C), the solvent (D), and the white pigment (E) are placed in a stirrer for stirring to be uniformly mixed into a solution state. If necessary, the additive (F) may also be added. After uniform mixing, a white photosensitive resin composition in liquid state may be obtained.

The contact angle of the spacer formed by the white photosensitive resin composition is ≥90°.

<Manufacturing Method of White Spacer>

An exemplary embodiment of the invention provides a white spacer formed using the white photosensitive resin composition above.

The white spacer may be formed by coating the white photosensitive resin composition above on a substrate to form a coating film and performing pre-bake, exposure, development, and post-bake on the coating film. For example, after the white photosensitive resin composition is coated on the substrate to form the coating film, a pre-exposure baking (i.e., pre-baking) step is performed at a temperature of 100° C. for 60 seconds. Next, the pre-baked coating film is exposed with light of 100 mJ/cm$^2$ using a high-pressure mercury lamp. Then, a developing step is performed on the exposed coating film in a KOH aqueous solution (0.038 wt %) for 60 seconds. Next, the developed coating film is rinsed using distilled water and nitrogen gas is blown to dry the coating film. Next, post-bake is performed at 220° C. for 45 minutes to form a white spacer on the substrate. In addition, in the exposure step above, a photomask having a predetermined pattern may also be used for exposure to form a patterned white spacer on the substrate.

The substrate may be a glass substrate, a plastic base material (such as a polyethersulfone (PES) board, a polycarbonate (PC) board, or a polyimide (PI) film), or other light-permeable substrates, and the type thereof is not particularly limited.

The coating method is not particularly limited, but a spray coating method, a roll coating method, a spin coating method, or the like may be used, and in general, a spin coating method is widely used. In addition, a coating film is formed, and then, in some cases, the residual solvent may be partially removed under reduced pressure.

The developing solution is not particularly limited, and a suitable developing solution may be selected according to needs. For example, the developing solution may be an aqueous solution of potassium hydroxide (KOH), and the concentration thereof may be 0.038 wt %.

In addition, the contact angle of the white spacer is preferably 90°.

<Light-Emitting Device>

An exemplary embodiment of the invention provides a light-emitting device including the white spacer above.

FIG. 1 is a diagram of a light-emitting device according to an embodiment of the invention. The light-emitting device 10 includes a substrate 120, a backlight module 200, and a light conversion layer 160, wherein the backlight module 200 and the substrate 120 are oppositely disposed, and the light conversion layer 160 is located between the substrate 120 and the backlight module 200. In the present embodiment, the light-emitting device 10 may further include a light filter layer 140, wherein the light filter layer 140 is located between the substrate 120 and the light conversion layer 160. The light-emitting device 10 may further include a gas barrier layer, a transparent optical adhesive layer, a polarizing plate, an alignment film, a liquid crystal (not shown), or other elements known to those having ordinary skill in the art, which are not repeated herein.

In the present embodiment, the substrate 120 is a light-permeable substrate. The material of the substrate 120 may be glass, organic polymer (for example, polyimide (PI), polyethersulfone (PES), or polycarbonate (PC)) or other suitable materials.

In the present embodiment, the light filter layer 140 includes a plurality of light filter patterns 142 and a plurality of black spacers 144. The plurality of black spacers 144 are respectively interposed between the plurality of light filter patterns 142, so that one of the light filter patterns 142 of the plurality of light filter patterns 142 is present between every two adjacent black spacers 144 in the plurality of black spacers 144. In addition, when viewed from a plane perpendicular to the thickness direction of the light filter layer 140, the plurality of black spacers 144 may be connected to each other to form a black matrix (not shown). The plurality of light filter patterns 142 include a red light filter pattern 142R, a green light filter pattern 142G, and a blue light filter pattern 142B. In other words, the light filter patterns 142 may be a red light filter pattern 142R, a green light filter pattern 142G, or a blue light filter pattern 142B. In addition, the red light filter pattern 142R, the green light filter pattern 142G, and the blue light filter pattern 142B do not contain a quantum dot. Here, the black spacers 144 are used as light-shielding layers.

In the present embodiment, the light conversion layer 160 includes a plurality of pattern layers 162 and a plurality of white spacers 164. The plurality of white spacers 164 are respectively interposed between the plurality of pattern layers 162 so that one of the pattern layers 162 of the plurality of pattern layers 162 is present between every two adjacent white spacers 164 in the plurality of white spacers 164. In addition, when viewed from a plane perpendicular to the thickness direction of the light conversion layer 160, the plurality of white spacers 164 are connected to each other to form a white matrix (not shown). The plurality of pattern layers 162 include a red pattern layer 162R, a green pattern layer 162G, and a scatterer pattern layer 162S. In other words, the pattern layers 162 may be a red pattern layer 162R, a green pattern layer 162G, or a scatterer pattern layer 162S. In addition, the red pattern layer 162R includes a red quantum dot. The green pattern layer 162G includes a green quantum dot. The scatterer pattern layer 162S does not contain a quantum dot. Here, the white spacers 164 are used as reflective layers.

In the present embodiment, the red pattern layer 162R is located under the red light filter pattern 142R; the green pattern layer 162G is located under the green light filter pattern 142G; and the scatterer pattern layer 162S is located under the blue light filter pattern 142B. Furthermore, the edge of the red pattern layer 162R of the light conversion layer 160 is substantially aligned with the edge of the red light filter pattern 142R of the light filter layer 140; the edge of the green pattern layer 162G of the light conversion layer 160 is substantially aligned with the edge of the green light filter pattern 142G of the light filter layer 140; and the edge of the scatterer pattern layer 162S of the light conversion layer 160 is substantially aligned with the edge of the blue light filter pattern 142B of the light filter layer 140.

In addition, the black spacers 144 in the light filter layer 140 are located on the white spacers 164 in the light conversion layer 160. Furthermore, the edge of the white spacers 164 in the light conversion layer 160 is substantially aligned with the edge of the black spacers 144 in the light filter layer 140.

The backlight module 200 irradiates the light conversion layer 160 with light. For example, the backlight module 200 is suitable for providing a light source, and the light emitted by the light source sequentially passes through the light conversion layer 160, the light filter layer 140, and the substrate 120 to provide a converted light source. In the present embodiment, the type of the light source used in the backlight module 200 may include an organic light-emitting diode (OLED), a micro-LED, or other suitable light sources. In the present embodiment, the backlight module 200 is a light source emitting blue light. After the blue light emitted by the backlight module 200 is absorbed by the red quantum dot in the red pattern layer 162R and the green quantum dot in the green pattern layer 162G, converted light may be emitted from the red pattern layer 162R and the green pattern layer 162G, respectively. Then, the converted light respectively passes through the red light filter pattern 142R and the green light filter pattern 142G of the light filter layer 140 to emit red light and green light. The blue light emitted by the backlight module 200 directly passes through the scatterer pattern layer 162S without a quantum dot to emit blue light, and then passes through the blue light filter pattern 142B of the light filter layer 140 to emit blue light. For example, when the light emitted by the light source through the light conversion layer 160 and the light filter layer 140 includes visible light (such as red light, green light, and blue light), the light-emitting device 10 may be applied to a display panel or other suitable devices. Therefore, the display panel of the light-emitting device 10 including the light conversion layer formed by the resin composition may display better brightness and color purity compared to a conventional display panel. However, the invention is not limited thereto. In an embodiment, the light filter layer 140 does not filter out near-infrared light, and therefore may also be used for applications emitting near-infrared light.

Figure 2:
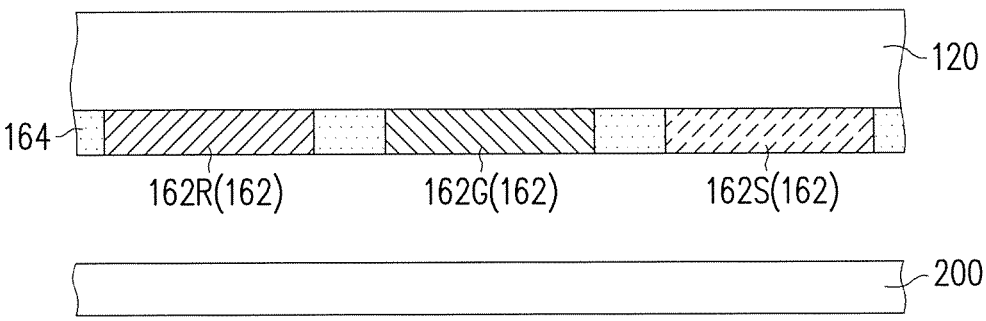
FIG. 2 is a diagram of a light-emitting device according to another embodiment of the invention.

FIG. 2 is a diagram of a light-emitting device according to another embodiment of the invention. It should be mentioned here that, the embodiment of FIG. 2 adopts the reference numerals of the embodiment of FIG. 1 and a portion of the contents thereof, wherein the same or similar numerals are used to represent the same or similar elements and descriptions of the same technical contents are omitted. The omitted portions are as described in the embodiments above and are not repeated in the embodiments below.

The main difference between the embodiment of FIG. 2 and the embodiment of FIG. 1 is that a light-emitting device 20 does not have the light filter layer 140.

Referring to FIG. 2, the light-emitting device 20 includes the substrate 120, the light conversion layer 160, and the backlight module 200, wherein the backlight module 200 and the substrate 120 are oppositely disposed, and the light conversion layer 160 is located between the substrate 120 and the backlight module 200. In the present embodiment, the light filter layer 140 without a quantum dot is not provided between the light conversion layer 160 and the substrate 120.

In the present embodiment, the light emitted by the light source provided by the backlight module 200 sequentially passes through the light conversion layer 160 and the substrate 120 to provide a converted light source. After the blue light emitted by the backlight module 200 is absorbed by the red quantum dot in the red pattern layer 162R and the green quantum dot in the green pattern layer 162G, the converted light may be emitted from the red pattern layer 162R and the green pattern layer 162G, respectively. The blue light emitted by the backlight module 200 directly passes through the scatterer pattern layer 162S without a quantum dot to emit blue light. For example, when the light emitted by the light source through the light conversion layer 160 includes visible light (such as red light, green light, and blue light), the light-emitting device 20 may be applied to a radiation-emitting device or other suitable devices. Therefore, compared with a conventional radiation-emitting device and/or the radiation-emitting device above including the light-emitting device 10, the radiation-emitting device including the light-emitting device 20 may not only display better brightness and color purity, but may also omit the step of manufacturing the light filter layer to reduce the manufacturing cost of the radiation-emitting device. For example, when the light emitted by the light source through the light conversion layer 160 includes near infrared light (for example, a wavelength of about 780 nm to 800 nm), the light-emitting device 20 may be applied to an electromagnetic radiation device or other suitable devices.

Hereinafter, the invention is described in detail with reference to Experimental examples. The following Experimental examples are provided to describe the invention, and the scope of the invention includes the scope of the claims and the substitutes and modifications thereof, and is not limited to the scope of the Experimental examples.

Experimental Examples of White Photosensitive Resin Composition and White Spacer The following describes Experimental example 1 to Experimental example 9 and Comparative example 1 to Comparative example 4 of the white photosensitive resin composition and the white spacer:

Experimental Example 1 a. White Photosensitive Resin Composition 39 parts by weight of a mixture of diallyl terephthalate and diallyl phthalate, 9.2 parts by weight of pentaerythritol tetrakis(3-mercaptobutyrate), 2.0 parts by weight of 2,2,3,3-tetrafluoropropyl acrylate, 50 parts by weight of a mixture of dipentaerythritol pentaacrylate and dipentaerythritol hexaacrylate, 88 parts by weight of the alkali-soluble resin (B-1-1), 29 parts by weight of the alkali-soluble resin (B-2-1) (manufactured by Miwon Commercial Co., Ltd.), 29 parts by weight of the alkali-soluble resin (B-2-2), 8.2 parts by weight of bis(2,4,6-trimethylbenzoyl)phenylphosphine oxide (trade name: Irgacure 819, manufactured by BASF), 2.0 parts by weight of 1,2-octanedione, 1-[4-(phenylthio) phenyl]-, 2-(o-benzoyloxime) (trade name: Irgacure OXE-01, manufactured by BASF), and 194 parts by weight of $TiO_2$ dispersion (manufactured by Sanyo Color Works, Ltd.) were added to 561 parts by weight of propylene glycol monomethyl ether acetate (PGMEA) and uniformly stirred via a stirrer to obtain the white photosensitive resin composition of Experimental example 1.

b. White Spacer

The white photosensitive resin composition prepared in Experimental example 1 was coated on a substrate by a spin coating method (spin coater model: MS-A150, manufactured by MIKASA Corporation, with a rotation speed of about 200 rpm) and pumped down to 133 Pa to remove excess solvent. Next, pre-baking was performed at a temperature of 100° C. for 60 seconds to form a thin film. Then, using a photomask having a straight-through pattern and a linewidth/spacing of 1 micron to 100 microns, the distance between the photomask and the thin film surface was controlled to be about 50 microns, and the pre-baked coating film was exposed with a light of 100 $mJ/cm^2$ to 150 $mJ/cm^2$ using a high-pressure mercury lamp containing g, h, i, $i^+$ rays (model: LS106SA, manufactured by ELS System Technology Co., Ltd.) to form a semi-finished product. Next, development was performed at a temperature of 23° C. using an aqueous solution of potassium hydroxide having a concentration of 0.038 wt % as a developing solution for 60 seconds. Next, the developed coating film was rinsed using distilled water and nitrogen gas was blown to dry the coating film. Next, after post-baking at 220° C. for 45 minutes, a white spacer having a pattern thickness of 10 microns (hereinafter referred to as "spacer") may be obtained. Each of the obtained spacers was evaluated by each of the following evaluation methods, and the results thereof are as shown in Table 2.

Experimental Example 2 to Experimental Example 9 and Comparative Example 1 to Comparative Example 4

The white photosensitive resin compositions of Experimental example 2 to Experimental example 9 and Comparative example 1 to Comparative Example 4 were prepared with the same steps as Experimental example 1, and the difference was that: the type and the use amount of the components of the white photosensitive resin compositions were changed (as shown in Table 2 and Table 3), wherein the components/compounds corresponding to the symbols in Table 2 and Table 3 are shown in Table 1. The prepared white photosensitive resin compositions were made into spacers and evaluated by the following evaluation methods. The results thereof are shown in Table 2 and Table 3. The blank spaces in Table 2 and Table 3 with no values indicate "no addition (the component)".

TABLE 1

| Symbol | Component/compound |
|---|---|

Polymerizable compound (A)

- A-1  A mixture of diallyl terephthalate and diallyl phthalate (manufactured by Chembridge Industrial Co., Ltd.)

- A-2  Pentaerythritol tetrakis(3-mercaptobutyrate) (trade name: Karenz PE1 AG, manufactured by Showa Denko Co., Ltd.)
- A-3  2,2,3,3-tetrafluoropropyl acrylate

- A-4  A mixture of dipentaerythritol pentaacrylate and dipentaerythritol hexaacrylate (trade name: KAYARAD DPHA, manufactured by Nippon Kayaku Co., Ltd.)
- A-5  Polyether-modified polydimethylsiloxane (trade name: BYK-307, manufactured by BYK Chemie Corporation)
- A-6  A mixture of pentaerythritol triacrylate and pentaerythritol tetraacrylate (trade name: KAYARAD PET-30, manufactured by Nippon Kayaku Co., Ltd.)

Alkali-soluble resin (B)

- B-1-1  Alkali-soluble resin (B-1-1) (manufactured by Miwon Commercial Co., Ltd), including a structural unit represented by formula (II-1-1), a structural unit represented by formula (II-2-1), and a structural unit represented by formula (1).

- B-2-1  Alkali-soluble resin (B-2-1) (manufactured by Miwon Commercial Co., Ltd.), including a structural unit represented by formula (II-1-1), a structural unit represented by formula (1), and a structural unit represented by formula (2).

TABLE 1-continued

| Symbol | Component/compound |
|---|---|

B-2-2   Alkali-soluble resin (B-2-2) (manufactured by Miwon Commercial Co., Ltd.), including a structural unit represented by formula (3), a structural unit represented by formula (4), a structural unit represented by formula (5), a structural unit represented by formula (6), and a structural unit represented by formula (7).

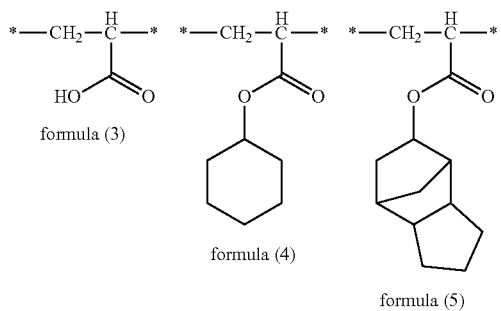

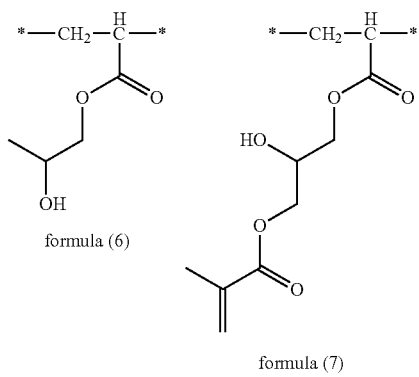

B-2-3   Alkali-soluble resin (B-2-3) (manufactured by Miwon Commercial Co., Ltd.), including a structural unit represented by formula (8) and a structural unit represented by formula (9).

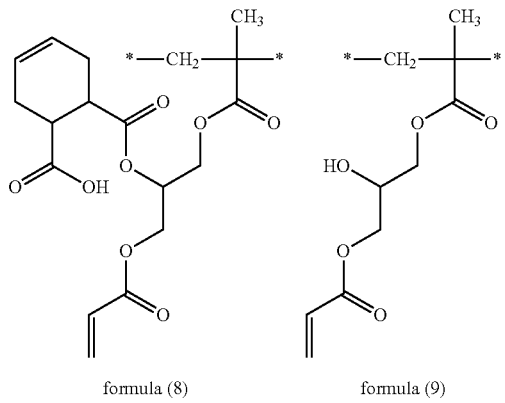

Photopolymerization initiator (C)

C-1   Acylphosphine oxide compound: bis(2,4,6-trimethylbenzoyl)phenylphosphine oxide (trade name: Irgacure 819, manufactured by BASF, compound represented by the following formula (III-1-2))

TABLE 1-continued

| Symbol | Component/compound |
|---|---|

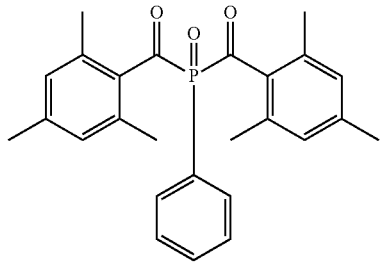

formula (III-1-2)

C-2  Acylphosphine oxide compound: 2,4,6-trimethylbenzoyl diphenylphosphine oxide (trade name: TPO, manufactured by BASF, compound represented by the following formula (III-1-1))

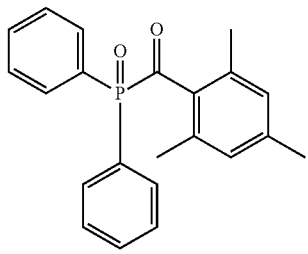

formula (III-1-1)

C-3  1,2-octanedione,1-[4-(phenylthio)phenyl]-,2-(o-benzoyloxime) (trade name: Irgacure OXE-01, manufactured by BASF)

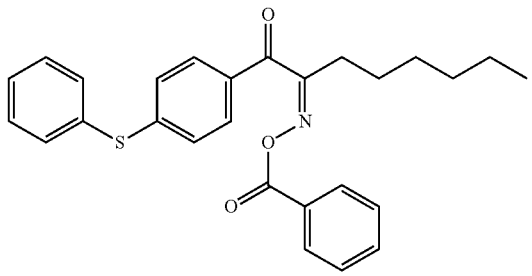

formula (III-2-1)

C-4  Oxime ester-based compound: PBG-3057 (manufactured by Changzhou Tronly New Electronic Materials Co., Ltd.).

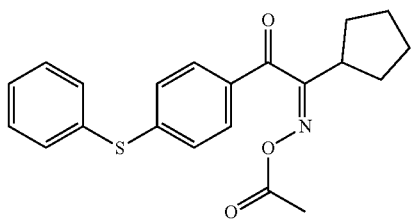

formula (III-2-2)

C-5  Compound represented by the following formula (IV) (trade name: Irgacure OXE-03, manufactured by BASF)

TABLE 1-continued

| Symbol | Component/compound |
|---|---|

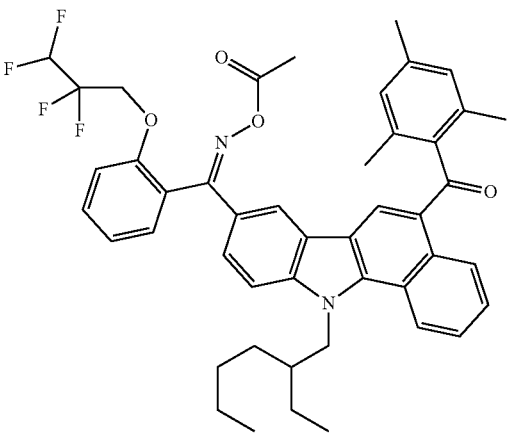

formula (IV)

Solvent (D)

| | |
|---|---|
| D-1 | Propylene glycol monomethyl ether acetate |

Pigment (E)

| | |
|---|---|
| E-1 | TiO₂ dispersion (manufactured by Sanyo Color Works, Ltd.) |

TABLE 21

| Component (unit: parts by weight) | | Experimental example 1 | Experimental example 2 | Experimental example 3 | Experimental example 4 | Experimental example 5 |
|---|---|---|---|---|---|---|
| Polymerizable compound (A) | A-1 | 39 | 40 | 40 | 39 | 20 |
| | A-2 | 9.2 | 9.1 | 9.2 | 9.2 | 9.2 |
| | A-3 | 2.0 | 0.5 | 1.0 | 2.0 | 2.0 |
| | A-4 | 50 | 51 | 50 | 50 | 68 |
| | A-5 | | | | | |
| | A-6 | | | | | |
| Alkali-soluble resin (B) | B-1-1 | 88 | 87 | 88 | 88 | 116 |
| | B-2-1 | 29 | 28 | 29 | 29 | 29 |
| | B-2-2 | 29 | 28 | 29 | 29 | |
| | B-2-3 | | | | | |
| Photopolymerization initiator (C) | C-1 | 8.2 | 5.1 | | 6.1 | 8.2 |
| | C-2 | | | 8.2 | | |
| | C-3 | 2.0 | 5.1 | 2.0 | | 2.0 |
| | C-4 | | | | 4.1 | |
| | C-5 | | | | | |
| Solvent (D) | D-1 | 561 | 558 | 561 | 561 | 561 |
| White pigment (E) | E-1 | 194 | 193 | 194 | 194 | 194 |
| (A-1 + A-2)/A (%) | | 48 | 49 | 49 | 48 | 30 |
| (A-3)/A (%) | | 2.0 | 0.5 | 1.0 | 2.0 | 2.0 |
| (C-1 + C-2)/C (%) | | 80 | 50 | 80 | 60 | 80 |
| Evaluation results | Resolution | ⊚ | ⊚ | ○ | ○ | ○ |
| | Heat resistant reflectivity | ⊚ | ⊚ | ⊚ | ⊚ | ⊚ |
| | Ink repellency | ⊚ | ○ | ○ | ⊚ | ⊚ |

| Component (unit: parts by weight) | | Experimental example 6 | Experimental example 7 | Experimental example 8 | Experimental example 9 |
|---|---|---|---|---|---|
| Polymerizable compound (A) | A-1 | 39 | 82 | 91 | 68 |
| | A-2 | 9.2 | 4.3 | 6.5 | 9.1 |
| | A-3 | 2.0 | 3.2 | 2.2 | 3.0 |
| | A-4 | 50 | 11 | | |
| | A-5 | | | | |
| | A-6 | | | | 20 |
| Alkali-soluble resin (B) | B-1-1 | | 91 | 62 | 87 |
| | B-2-1 | 72 | 30 | 20 | 28 |

TABLE 21-continued

|  |  |  |  |  |  |
|---|---|---|---|---|---|
|  | B-2-2 | 72 |  |  |  |
|  | B-2-3 |  | 30 | 20 | 28 |
| Photopolymerization initiator (C) | C-1 | 8.2 | 2.1 | 4.3 | 2.0 |
|  | C-2 |  |  |  |  |
|  | C-3 | 2.0 | 8.5 | 2.2 | 8.1 |
|  | C-4 |  |  |  |  |
|  | C-5 |  |  |  | 0.7 |
| Solvent (D) | D-1 | 561 | 585 | 396 | 556 |
| White pigment (E) | E-1 | 194 | 202 | 101 | 192 |
| (A-1 + A-2)/A (%) |  | 48 | 86 | 98 | 77 |
| (A-3)/A (%) |  | 2.0 | 3.2 | 2.2 | 3.0 |
| (C-1 + C-2)/C (%) |  | 80 | 20 | 60 | 20 |
| Evaluation results | Resolution | ○ | ◉ | ◉ | ◉ |
|  | Heat resistant reflectivity | ◉ | ○ | ○ | ◉ |
|  | Ink repellency | ◉ | ◉ | ◉ | ◉ |

TABLE 3

| Component (unit: parts by weight) |  | Comparative example 1 | Comparative example 2 | Comparative example 3 | Comparative example 4 |
|---|---|---|---|---|---|
| Polymerizable compound (A) | A-1 |  |  |  |  |
|  | A-2 |  |  |  |  |
|  | A-3 | 2.2 | 1.1 |  |  |
|  | A-4 | 98 |  | 98 | 52 |
|  | A-5 |  |  | 2.2 | 1.9 |
|  | A-6 |  | 99 |  | 46 |
| Alkali-soluble resin (B) | B-1-1 | 97 | 48 | 97 | 80 |
|  | B-2-1 | 31 | 16 | 31 | 26 |
|  | B-2-2 | 31 | 16 | 31 | 26 |
|  | B-2-3 |  |  |  |  |
| Photopolymerization initiator (C) | C-1 | 9.0 | 4.5 |  |  |
|  | C-2 |  |  |  |  |
|  | C-3 | 2.2 | 1.1 |  | 4.6 |
|  | C-4 |  |  |  | 4.6 |
|  | C-5 |  |  | 11.2 |  |
| Solvent (D) | D-1 | 618 | 307 | 618 | 509 |
| White pigment (E) | E-1 | 213 | 56 | 213 | 176 |
| (A-1+A-2)/A (%) |  | 0 | 0 | 0 | 0 |
| (A-3)/A (%) |  | 2.2 | 1.1 | 0 | 0 |
| (C-1+C-2)/C (%) |  | 80 | 80 | 0 | 0 |
| Evaluation results | Resolution | Δ | X | X | X |
|  | Heat resistant reflectivity | X | X | X | X |
|  | Ink repellency | ◉ | ○ | X | X |

<Evaluation Methods> a. Resolution

Figure 3A:
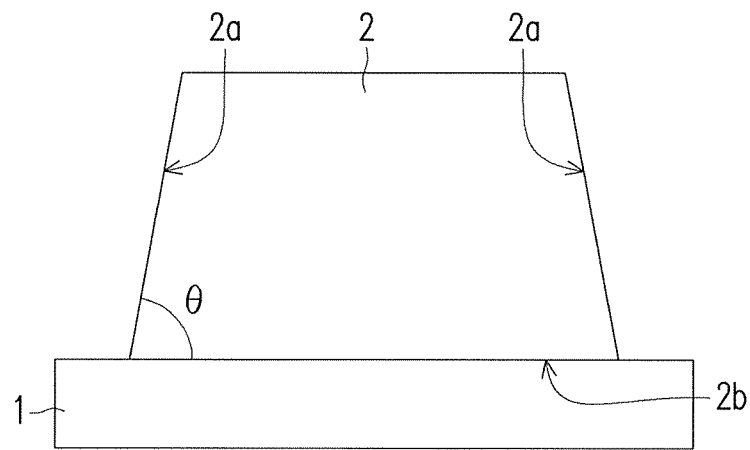
FIG. 3(a) and FIG. 3(b) are structural diagrams of a spacer.
Figure 3B:
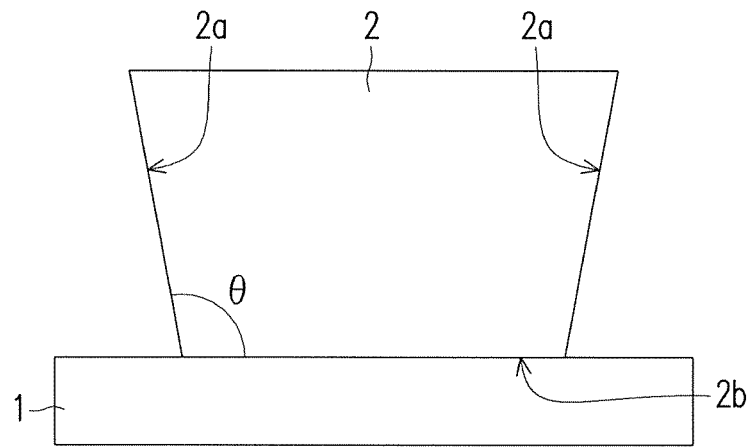

The resolution is comprehensively evaluated by measuring the value of a taper angle θ and observing whether there is white photosensitive resin composition residue on the substrate.

a1. Measurement of taper angle θ: the prepared spacers were observed with an electron microscope (model: SU8000, manufactured by Hitachi) at a magnification of 10000 times, and the taper angle of the spacers on the substrate was observed. Specifically, FIG. 3(a) and FIG. 3(b) are structural diagrams of a spacer. As shown in FIG. 3(a) and FIG. 3(b), a spacer 2 is located on a substrate 1. The spacer 2 has two side surfaces 2a and a bottom surface 2b, wherein the bottom surface 2b is connected to the substrate 1, and the two side surfaces 2a are respectively adjacent to the bottom surface 2b. The angle between any of the two side surfaces 2a and the bottom surface 2b is defined as the taper angle θ. The measured taper angle may be less than 90° (as shown in FIG. 3(a)), greater than 90° (as shown in FIG. 3(b)), or equal to 90° (not shown).

a2. Observation on whether there is white photosensitive resin composition residue on the substrate: the prepared spacers were observed with an optical microscope (model: MX61, manufactured by Olympus Co., Ltd.), specifically whether the pattern characteristics of an opening portion (width of 30 microns) between two adjacent spacers were kept neat and whether there was white photosensitive resin composition residue at the edge of the pattern on the substrate were observed.

The evaluation criteria of resolution are as follows:

◉: 85°≤taper angle θ≤95°, no white photosensitive resin composition residue at the edge of the pattern on the substrate;

○: 85°≤taper angle θ≤95°, some white photosensitive resin composition residue at the edge of the pattern on the substrate;

Δ: 75°≤taper angle θ<85°, or 95°<taper angle θ≤105°, or a portion of white photosensitive resin composition residue on the substrate;

X: taper angle θ<75°, 105°<taper angle θ, or a large amount of white photosensitive resin composition residue on the substrate.

b. Heat Resistant Reflectivity

After the resulting spacers were baked at 250° C. for 1 hour, the light reflectivity was measured using a spectrodensitometer (model: CM2600D, manufactured by Konica Minolta Co., Ltd.) The light reflectivity is the percentage of the reflected colored light density containing the regular reflected light to incident light. The reflectivity of blue light at 450 nm was measured.

The evaluation criteria of heat resistant reflectivity are as follows:

⊚: 75%≤reflectivity;
○: 72%≤reflectivity<75%;
Δ: 70%≤reflectivity<72%;
X: reflectivity<70%.

c. Ink Repellency (Hydrophobicity)

Pure water was added dropwise on the surface of the spacers using a micro-syringe, and a contact angle φ between the tangent of the solvent at the liquid-solid-gas interface and the surface of the spacers was measured using a contact angle measurement device (model: DropMaster 500, manufactured by KYOWA Corporation) when the solvent was on the spacers.

The evaluation criteria of ink repellency (hydrophobicity) are as follows:

⊚: 95°≤contact angle φ;
○: 90°≤contact angle φ<95°;
Δ: 80°≤contact angle φ<90°;
X: contact angle φ<80°.

<Evaluation Results>

It may be seen from Table 2 and Table 3 that when the polymerizable compound (A) includes an ethylenically-unsaturated monomer having a total content of 10 mass % to 98 mass % and a thiol compound having two or more thiol groups in one molecule (Experiment examples 1 to 9), the resolution and the heat resistant reflectivity of the white photosensitive resin composition and the resulting spacer are good. In contrast, when the polymerizable compound (A) does not include an ethylenically-unsaturated monomer and a thiol compound having two or more thiol groups in one molecule (Comparative examples 1 to 4), the resolution and the heat resistant reflectivity of the white photosensitive resin composition and the resulting spacer are poor.

In addition, when the polymerizable compound (A) includes the fluorine-containing ethylenically-unsaturated monomer (A-3) (Experimental examples 1 to 9), the white photosensitive resin composition and the resulting spacer have good ink repellency. When the white photosensitive resin composition does not include the fluorine-containing ethylenically-unsaturated monomer (A-3) (Comparative examples 3 and 4), the white photosensitive resin composition and the resulting spacer have poor ink repellency.

In addition, when the polymerizable compound (A) includes the fluorine-containing ethylenically-unsaturated monomer (A-3) at 2 mass % to 5 mass % (Experimental examples 1 and 4 to 9), the ink repellency of the white photosensitive resin composition and the resulting spacer may be further improved.

Based on the above, the white photosensitive resin composition of the invention includes a specific polymerizable compound to provide a white photosensitive resin composition having good resolution, heat resistant reflectivity, and ink repellency, thereby achieving the effect of having both good resolution and good reflectivity.

What is claimed is:

1. A white photosensitive resin composition, comprising:
a polymerizable compound (A);
an alkali-soluble resin (B);
a photopolymerization initiator (C);
a solvent (D); and
a white pigment (E),
wherein the polymerizable compound (A) comprises an ethylenically-unsaturated monomer (A-1) represented by formula (I-1) and a thiol compound (A-2) having two or more thiol groups in one molecule,
based on 100 mass % of the polymerizable compound (A), a total content of the ethylenically-unsaturated monomer (A-1) and the thiol compound (A-2) is 10 mass % to 98 mass %,

formula (I-1)

in formula (I-1), $X^1$ represents a divalent to tetravalent organic group, and m represents an integer of 2 to 4.

2. The white photosensitive resin composition of claim 1, wherein in formula (I-1), when m represents 2, $X^1$ represents a divalent alicyclic group, a divalent aromatic group, or a divalent heterocyclic group.

3. The white photosensitive resin composition of claim 1, wherein in formula (I-1), when m represents 2, $X^1$ represents 1,2-phenylene, 1,3-phenylene, or 1,4-phenylene.

4. The white photosensitive resin composition of claim 1, wherein the thiol compound (A-2) is a compound represented by formula (I-2),

formula (I-2)

in formula (I-2), $X^2$ represents a divalent to tetravalent organic group, and n represents an integer of 2 to 4.

5. The white photosensitive resin composition of claim 4, wherein in formula (I-2), when n represents 4, $X^2$ represents a tetravalent alkane tetrayl group.

6. The white photosensitive resin composition of claim 1, wherein the polymerizable compound (A) further comprises a fluorine-containing ethylenically-unsaturated monomer (A-3) represented by formula (I-3),

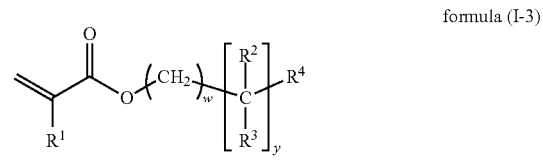

formula (I-3)

in formula (I-3), $R^1$ represents a hydrogen atom or a methyl group, $R^2$ and $R^3$ respectively represent a hydrogen atom or a fluorine atom, at least one of $R^2$ and $R^3$ is a fluorine atom, $R^4$ represents a hydrogen atom, a fluorine atom, or an alkyl group, w represents an integer of 1 to 10, and y represents an integer of 1 to 10.

7. The white photosensitive resin composition of claim 6, wherein based on 100 mass % of the polymerizable compound (A), the fluorine-containing ethylenically-unsaturated monomer (A-3) is 0.5 mass % to 5 mass %.

8. The white photosensitive resin composition of claim 1, wherein the alkali-soluble resin (B) does not contain fluorine.

9. The white photosensitive resin composition of claim 1, wherein the alkali-soluble resin (B) comprises an alkali-soluble resin (B-1), and the alkali-soluble resin (B-1) comprises a structural unit represented by formula (II-1) and a structural unit represented by formula (II-2),

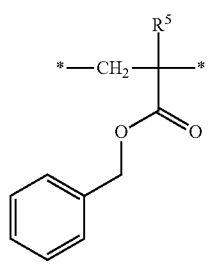

formula (II-1)

in formula (II-1), $R^5$ represents a hydrogen atom or a methyl group, and * represents a bonding position,

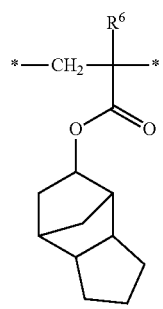

formula (II-2)

in formula (II-2), $R^6$ represents a hydrogen atom or a methyl group, and * represents a bonding position.

10. The white photosensitive resin composition of claim 1, wherein the photopolymerization initiator (C) comprises an acylphosphine oxide compound represented by formula (III-1),

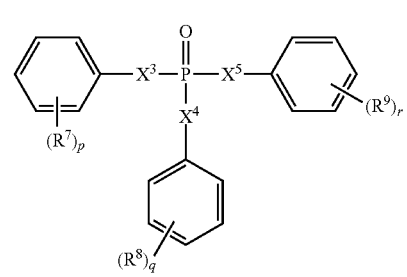

formula (III-1)

in formula (III-1), $X^3$, $X^4$, and $X^5$ respectively represent a single bond or a carbonyl group, at least one of $X^3$, $X^4$, and $X^5$ is a carbonyl group, $R^7$, $R^8$, and $R^9$ respectively represent an alkyl group, and p, q, and r respectively represent an integer of 0 to 5.

11. The white photosensitive resin composition of claim 1, wherein the white pigment (E) is at least one selected from the group consisting of aluminum oxide, magnesium oxide, antimony oxide, titanium oxide, zirconium oxide, zinc oxide, silicon dioxide, aluminum hydroxide, magnesium hydroxide, barium sulfate, calcium sulfate, magnesium carbonate, barium carbonate, calcium carbonate, strontium titanate, aluminum powder, kaolin, clay, talc, barium titanate, and montmorillonite.

12. A white spacer formed by the white photosensitive resin composition of claim 1.

13. The white spacer of claim 12, wherein a contact angle thereof is 90°.

14. A light-emitting device comprising the white spacer of claim 12.

15. A light conversion layer, comprising:
a plurality of pattern layers; and
a plurality of white spacers formed by the white photosensitive resin composition of claim 1;
wherein the plurality of white spacers are respectively interposed between the plurality of pattern layers, so that one of the plurality of pattern layers is present between every two adjacent white spacers in the plurality of white spacers.

16. The light conversion layer of claim 15, wherein the pattern layers are a red pattern layer, a green pattern layer, or a scatterer pattern layer.

17. A light-emitting device, comprising:
a substrate;
a backlight module disposed opposite to the substrate; and
a light conversion layer located between the substrate and the backlight module,
wherein the light conversion layer is the light conversion layer of claim 15.

18. The light-emitting device of claim 17, further comprising a light filter layer located between the substrate and the light conversion layer.

* * * * *